United States Patent [19]
Park

[11] Patent Number: 5,905,688
[45] Date of Patent: May 18, 1999

[54] AUTO POWER DOWN CIRCUIT FOR A SEMICONDUCTOR MEMORY DEVICE

[75] Inventor: Jong-Hoon Park, Choongcheongbuk-Do, Rep. of Korea

[73] Assignee: LG Semicon Co., Ltd., Cheongju, Rep. of Korea

[21] Appl. No.: 09/030,844

[22] Filed: Feb. 26, 1998

[30] Foreign Application Priority Data

Apr. 1, 1997 [KR] Rep. of Korea .................. 1997/11977

[51] Int. Cl.$^6$ ....................................................... G11C 7/00
[52] U.S. Cl. ........................... 365/227; 365/226; 365/233
[58] Field of Search .................................... 365/201, 226, 365/227, 233, 233.5

[56] References Cited

U.S. PATENT DOCUMENTS 5,400,282  3/1995  Suzuki ..................................... 365/201
5,646,902  7/1997  Park ........................................ 365/227

*Primary Examiner*—Son Mai
*Attorney, Agent, or Firm*—Fleshner & Kim

[57] ABSTRACT

A power down circuit for a memory device is provided that includes a burn-in voltage detector to generate a burn-in voltage detecting signal to control a power down signal when a burn-in voltage reaches a predetermined level. The power down circuit enhances a burn-in function by operating the memory cells and peripheral circuits for a relatively long time at a high level voltage when a burn-in is performed on the memory device with an auto power down function. Thus, the memory device reliability is also enhanced. The memory device includes a power down timer for generating a power down signal to control an input/output operation of a memory cell in response to a plurality of address transition detecting signals, a plurality of data input detecting signals, a chip select detecting signal, a write mode detecting signal and the burn-in voltage detecting signal.

18 Claims, 9 Drawing Sheets

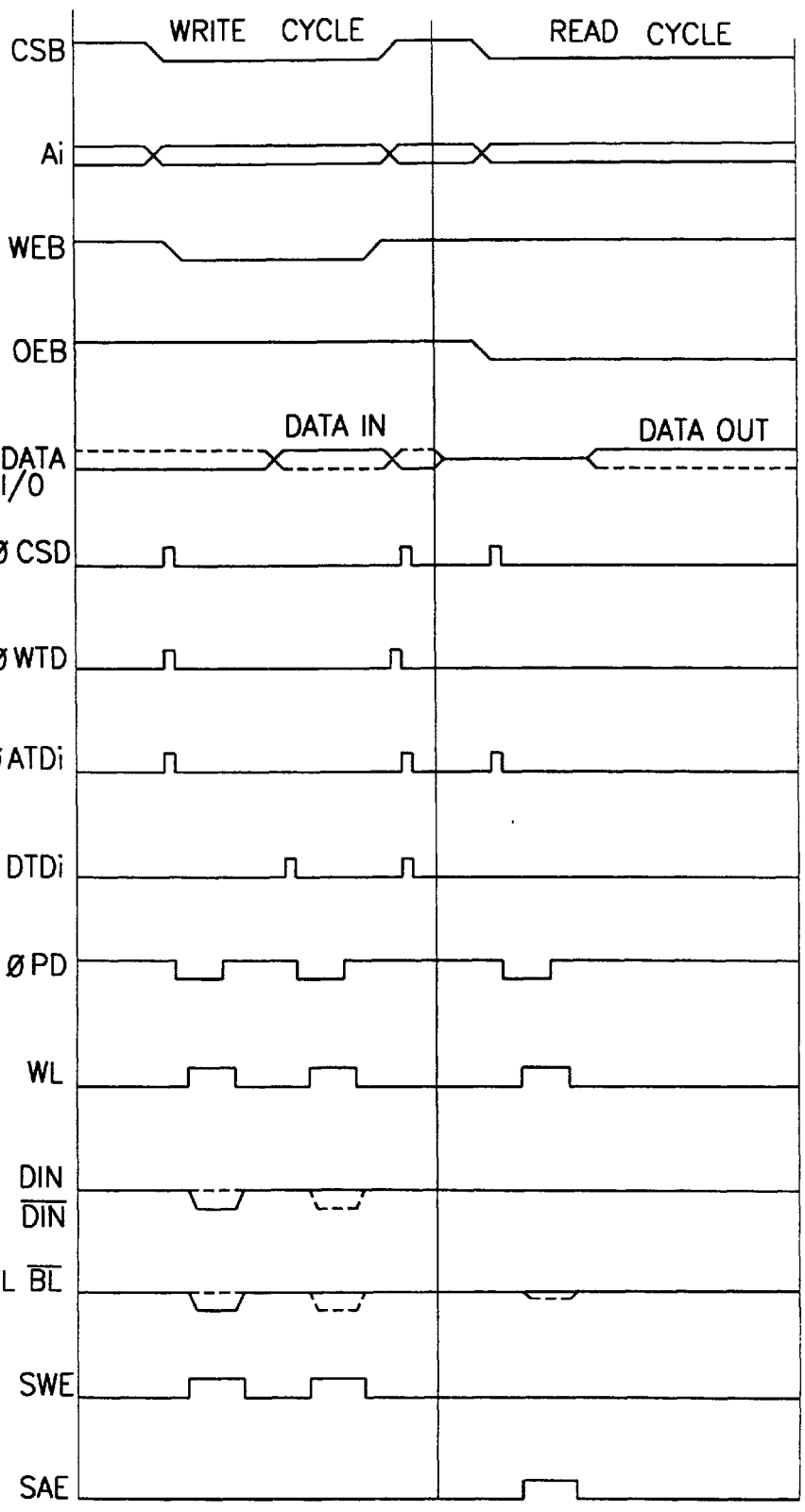

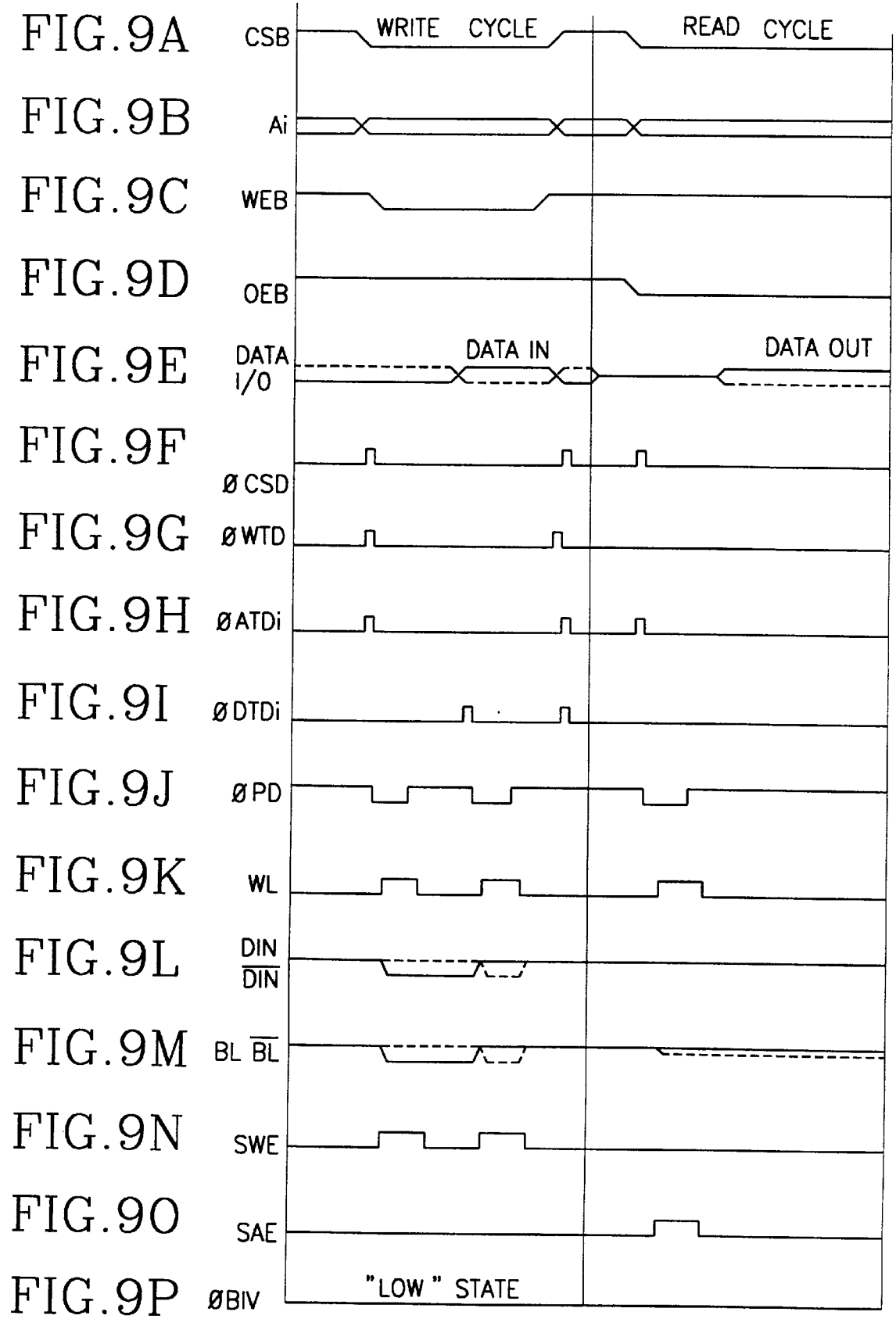

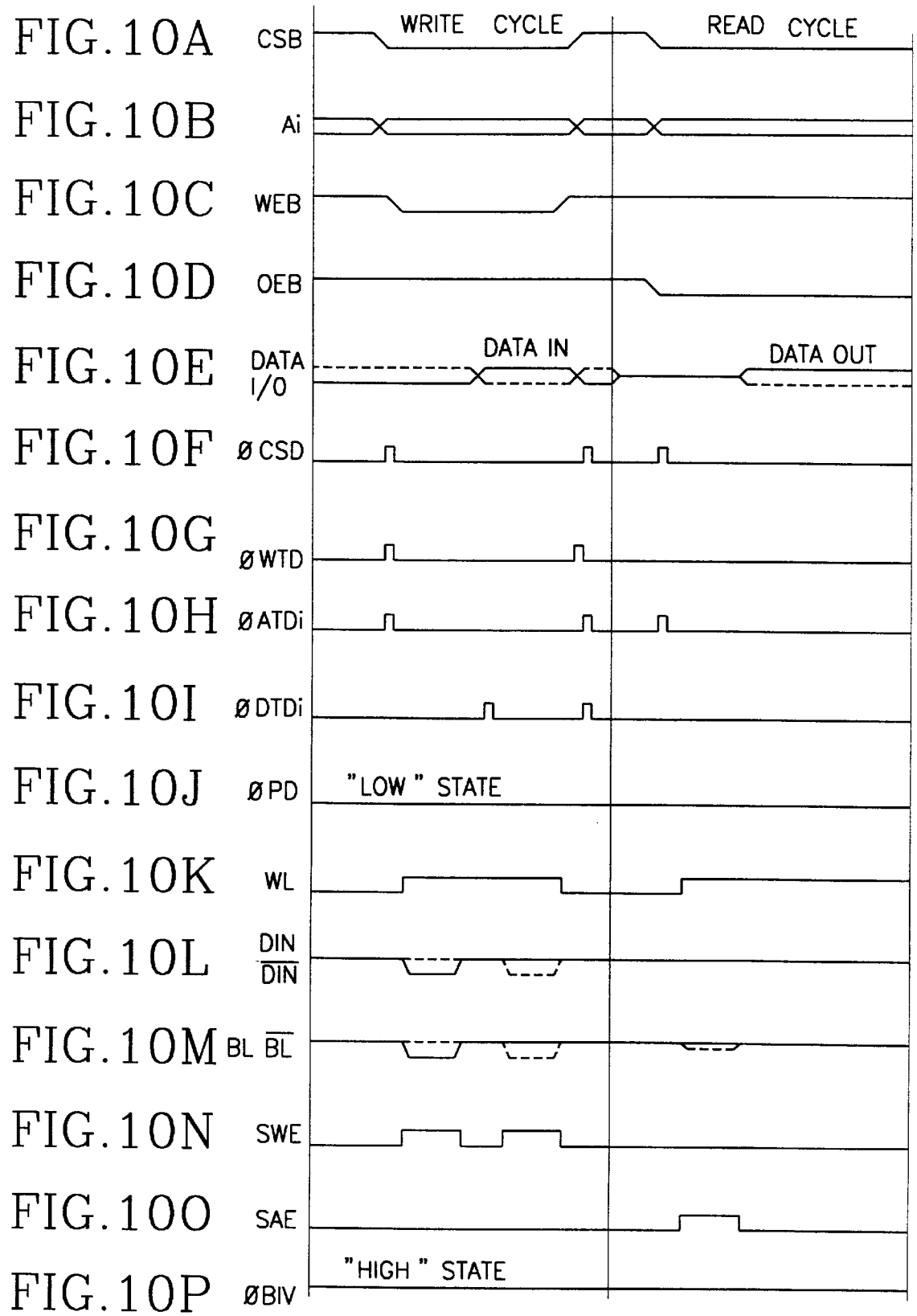

AUTO POWER DOWN CIRCUIT FOR A SEMICONDUCTOR MEMORY DEVICE

BACKGROUND OF THE INVENTION

1. Field of the Invention

The present invention relates to a memory device, and in particular, to a power down circuit for a memory device.

2. Background of the Related Art

Burn-in mode is performed on a memory device to eliminate premature failures after fabricating a substrate and packaging the memory device regardless of an auto power down function. In the burn-in mode, a high voltage is applied to operate memory cells and neighboring circuits, and thereby, a vulnerable memory device can be eliminated.

In a static random access memory device (SRAM), a direct current (DC) voltage keeps flowing through power source supplying elements during a read cycle and a write cycle in a burn-in mode as well as in a normal mode, which results in a high power consumption in the SRAM. However, reducing power consumption in the SRAM is desirable.

U.S. Pat. No. 4,962,487 (issued: Oct. 9, 1990) discloses a method for reducing power consumption during a write cycle, which was proposed to satisfy the demand for lower SRAM power consumption. In U.S. Pat. No. 4,962,487, the cycle for performing an actual write operation is not determined using a write cycle determined by an external control signal, but by a cycle during which a pulse signal generator generates an arbitrary pulse signal. Therefore, when an actual write cycle is finished, the mode is converted into a power down mode even during a write cycle according to the pulse signal generator.

U.S. Pat. No. 4,947,379 (issued: Aug. 7, 1990) discloses data output circuits connected to word lines and bit lines that are disabled after a word line enabling pulse signal and a sense amplifier enabling pulse signal are finished. Thereby, power consumption during the read cycle can be reduced.

FIG. 1 is a block diagram showing a related art power down circuit. As shown in FIG. 1, a power down timer 15 receives a plurality of address transition detecting signal (ØATD1 ... ØATDk) from an address transition detector 5, a chip select detecting signal (ØCSD) and a write mode detecting signal (ØWTD) from a chip select/write mode detector 13 and a plurality of data input detecting signals (ØDTD1 ... ØDTDn) from a data transition detector 33, to generate a power down signal (ØPD) having an arbitrary pulse width.

FIG. 2 is a circuit diagram showing the power down timer 15. As shown in FIG. 2, the power down timer 15 receives the address transition detecting signals (ØATD1 ... ØATDk), the data input detecting signals (ØDTD1 ... ØDTDn), the chip select detecting signal (ØCSD) and the write mode detecting signal (ØWTD), respectively, through NOR gates 42,44,46. A NAND gate 48 receives the output signals from the NOR gates 42,44,46. An output signal from the NAND gate 48 is inputted to a pulse extending circuit 50, from which the power down signal (ØPD) is generated in response to any transition among the detecting signals.

As shown in FIG. 1, the power down signal (ØPD) controls a data input circuit 29 and is inputted to a plurality of NOR gates (NOR1 ... NORn) to enable a plurality of word lines (WL1 ... WLn). The power down signal (ØPD) is also inputted to a NOR gate 17 to enable a write switching signal (ØSWE) for connecting the data input circuit 29 to a pair of data lines (DL,DLB). The power down signal is also inputted to a NOR gate 31 to generate a sense amplifier enabling signal (ØSAE).

With reference to the timing waveform diagrams shown in FIG. 3, the read and write operations of the circuit in FIG. 1 will now be described. During a write cycle, a chip select signal (ØCSB) and a write enabling signal (WEB) are maintained low level, as shown in FIGS. 3A and 3C. In addition, an output enabling signal (OEB) is maintained high level as shown in FIG. 3D.

First, when a write cycle starts, the chip select detecting signal (CSD) is outputted as a high pulse signal as shown in FIG. 3F in response to a level transition of the chip select signal (ØCSB). Further, the address transition detecting signals (ØATDi:i=1 ... k) are outputted as a high pulse signal as shown in FIG. 3H in response to a transition of address bits (Ai:i=1 ... k) as shown in FIG. 3B.

The write mode detecting signal (ØWTD) is outputted as a high pulse signal, as shown in FIG. 3G, in response to a transition to a low level of the write enabling signal (WEB). The data detecting signals (ØDTDi:i=1 ... n) are outputted as a high pulse signal shown in FIG. 3I, in response to a transition of an input data bit. Accordingly, the power down signal (ØPD) shown in FIG. 3J is generated from the power down timer 15 in accordance with a logical state of the above-mentioned detecting signals (ØCSD, ØWTD, ØATDi and ØDTDi).

While the power down signal (ØPD) is maintained low level with a predetermined pulse width by the pulse extending circuit 50, the selected word lines (WLi:i=1 ... n) are enabled. Then, when the power down signal (ØPD) becomes a high level, the enabling operation for the word line (WLi) is finished. Accordingly, the data input circuit 29 is disabled and the write switching signal (ØSWE) becomes low level as shown in FIG. 3N. As a result, current is inhibited from flowing from the data input circuit 29 to the memory cells.

During the read cycle, the chip select signal (ØCSB), the write enabling signal (WEB) and the output enabling signal (OEB) are maintained low, high and low levels, respectively, as shown in FIGS. 3A, 3C and 3D. In accordance with the power down signal (PD) maintained low level as shown in FIG. 3J, the sense amplifier enabling signal (ØSAE) is outputted as a high pulse signal as shown in FIG. 3O during the cycle of the predetermined pulse width of the power down signal (PD). Then, the selected word line (WLi) and the sense amplifier 35 are disabled after a latching operation by the data output buffer 37 when the power down signal (PD) is transited to be high level. That is, the circuit in FIG. 1 disables a word line in a burn-in mode after a data writing into the memory cells is performed during the write cycle and disables the word line and the sense amplifier after a data reading from the memory cells is performed during the read cycle. Thereby, the current path is cut off, which reduces the power consumption.

However, the related art power down circuit has various disadvantages. When a burn-in is performed to eliminate premature failures irrespective of a power down function after the memory device is packaged or a wafer is produced, a high voltage is applied to a memory cell as shown in FIG. 4 and to peripheral circuits for the operation thereof, thereby to prevent a vulnerability in a semiconductor device. In particular, the burn-in eliminates defects in a gate oxide of a transistor. However, in related art memory devices having an auto power down function, burning-in proceeds only during a relatively short period when powering-down does not occur. Thus, a burn-in effect influences only part of the memory cells and peripheral circuits, and as a whole, the burn-in effect is reduced.

The above references are incorporated by reference herein where appropriate for appropriate teachings of additional or alternative details, features and/or technical background.

SUMMARY OF THE INVENTION

An object of the present invention is to substantially obviate at least the problems in the related art.

Another object of the present invention is to enhance burn-in function reliability.

A further object of the present invention is to provide a power down circuit for a memory device that operates memory cells and peripheral circuits during burn-in.

A still further object of the present invention is to provide a power down circuit for a memory device that operates memory cells and peripheral circuits at a high voltage for a relatively long period during a burn-in mode in a memory device with an auto power down function.

To achieve at least the above objects in a whole or in parts, there is provided a power down circuit for a memory device according to the present invention that includes a power down timer for generating a power down signal in response to a plurality of address transition detecting signals, a plurality of data input detecting signals, a chip select detecting signal and a write mode detecting signal and a burn-in voltage detector for generating a burn-in voltage detecting signal for detecting a burn-in voltage and enabling a power down signal.

To further achieve the above objects in a whole or in part, there is provided a memory device according to the present invention that includes a plurality of memory cells arranged in a matrix form, each memory cell coupled to first and second signal lines, a power down timer that generates a power down signal to control a data input/output operation of a selected memory cell in response to a plurality of address transition detecting signals, a plurality of data input detecting signals, a chip select detecting signal and a write mode detecting signal and a burn-in voltage detector that generates a burn-in voltage detecting signal to control a power down timer when a burn-in voltage is received.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIGS. 3A–3O are diagrams showing timing waveforms of write and read operations in the memory device of FIG. 1;

FIGS. 9A–9P are diagrams of timing waveforms of an operating mode of a memory device having a power down circuit according to a preferred embodiment of the present invention; and FIGS. 10A–10P are diagrams of timing waveforms of a burn-in mode of a memory device having a power down circuit according to a preferred embodiment of the present invention.

DETAILED DESCRIPTION OF PREFERRED EMBODIMENTS

Figure 1:
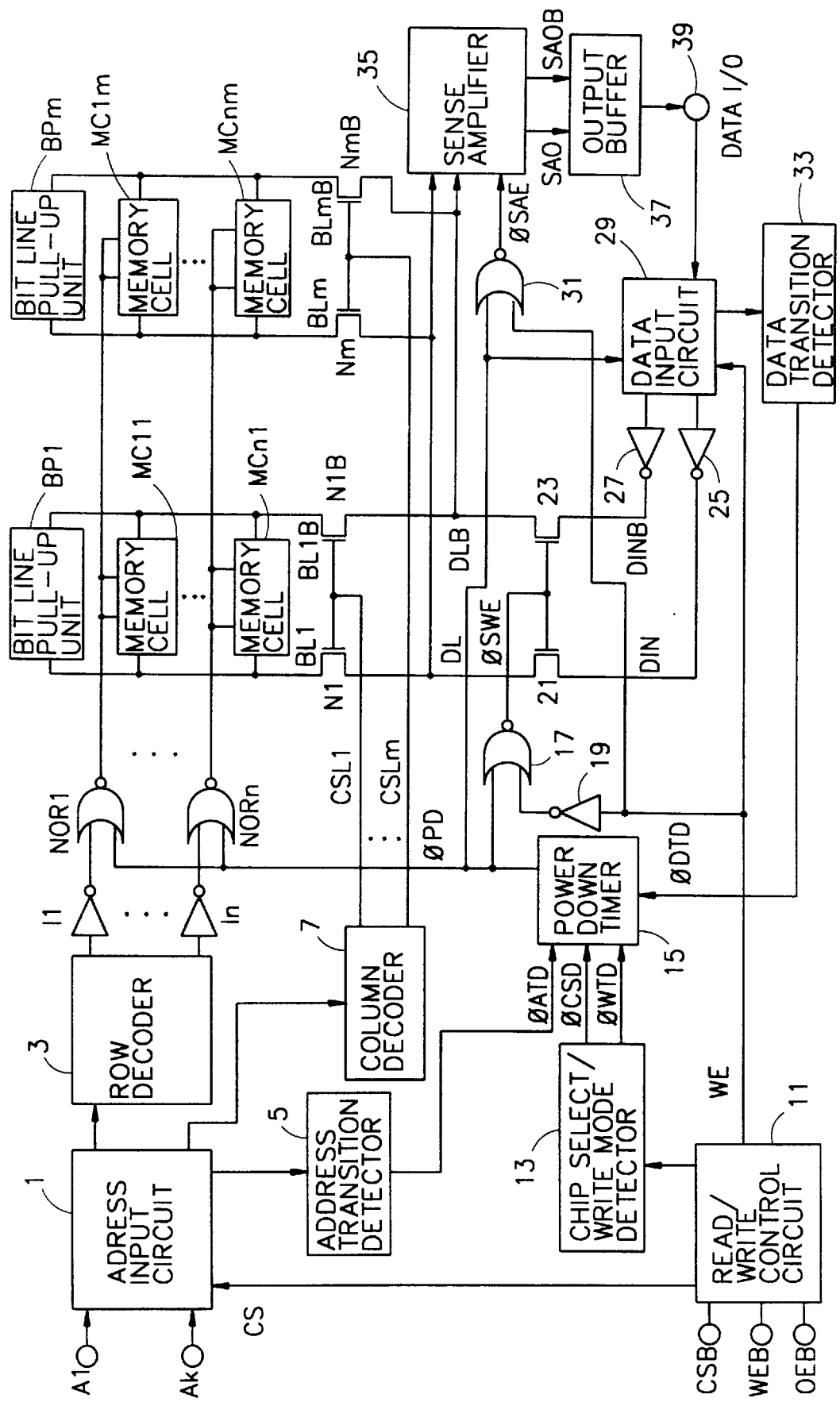
FIG. 1 is a block diagram showing a related art memory device having an auto power down circuit.
Figure 2:
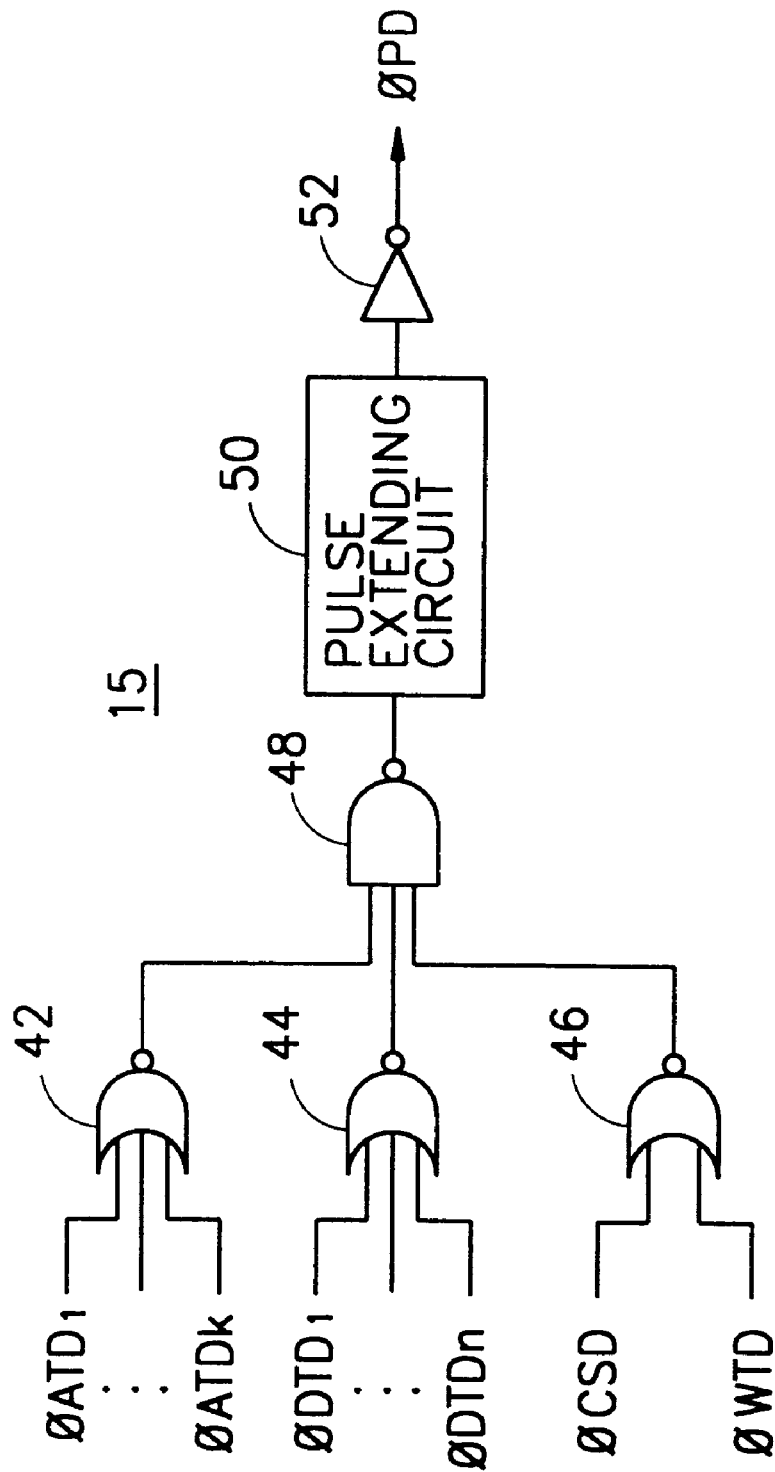
FIG. 2 is a circuit diagram showing a power down timer of the memory device of FIG. 1.
Figure 4A:
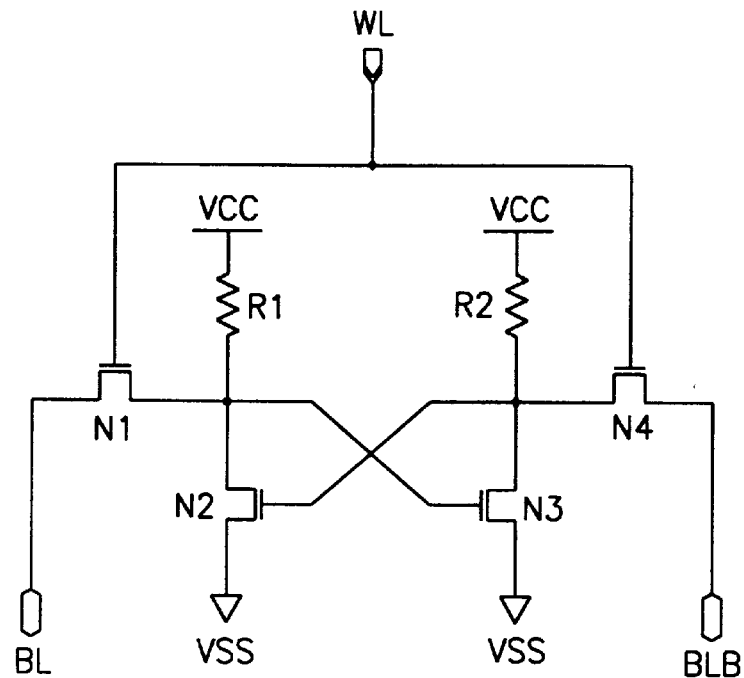
FIGS. 4A–4B are circuit diagrams showing a memory cell of a memory device.
Figure 4B:
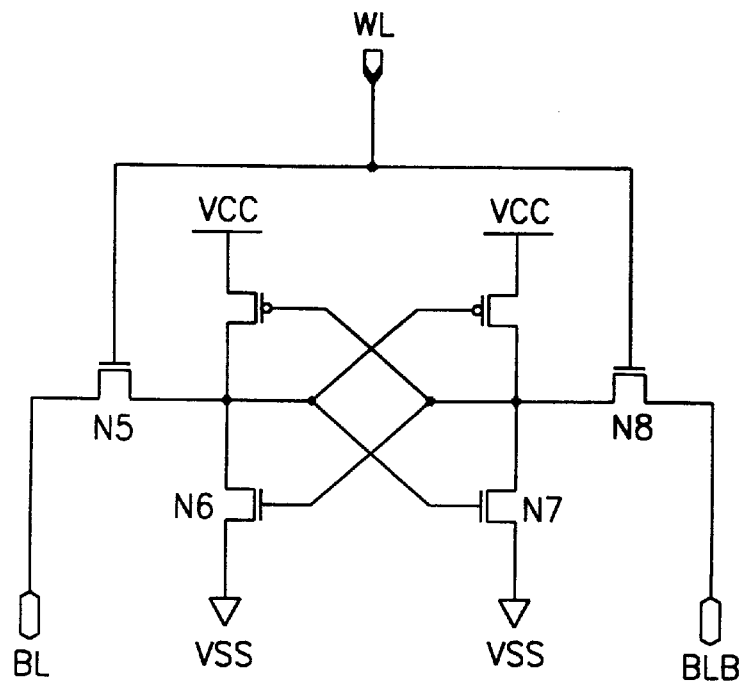
Figure 5:
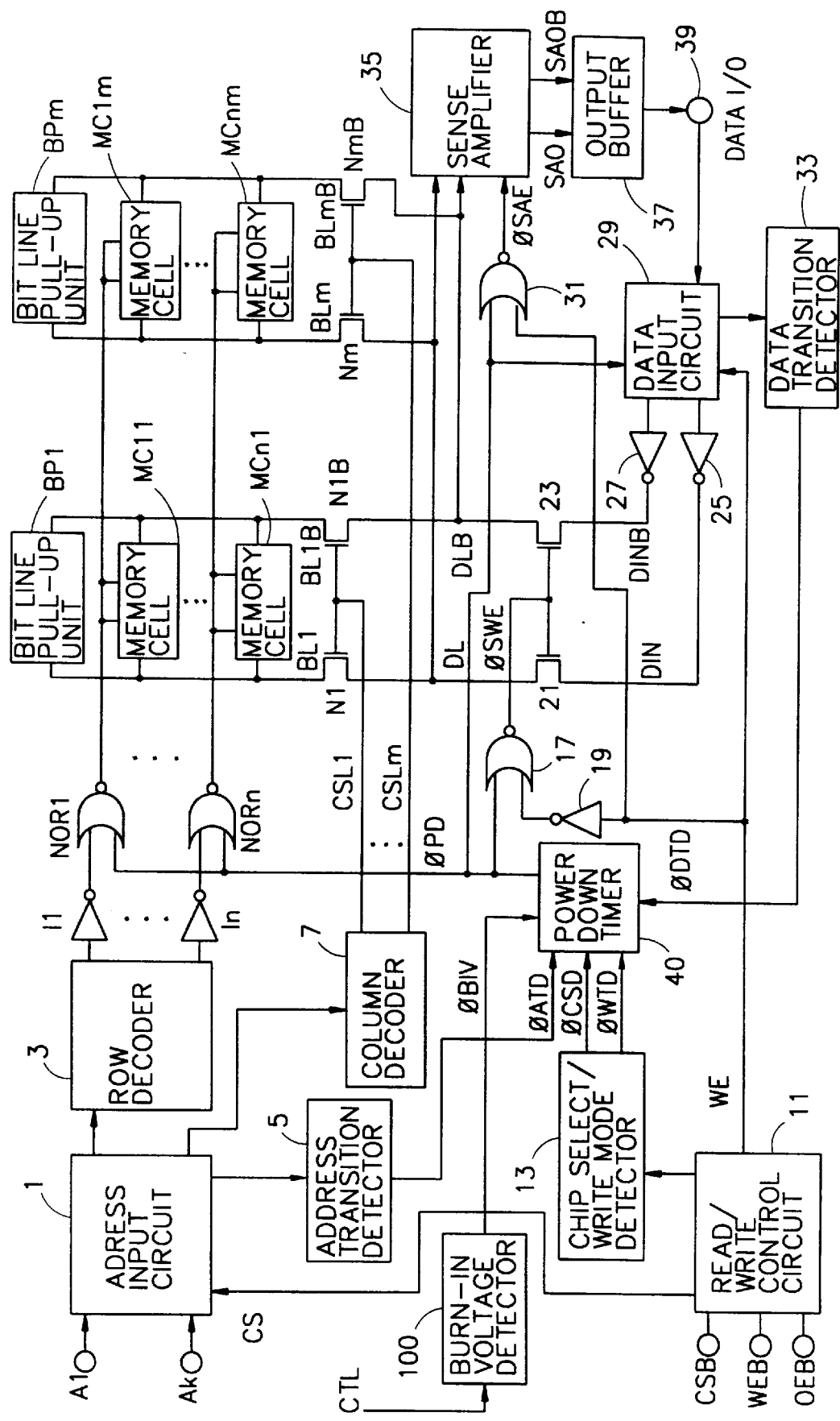
FIG. 5 is a block diagram showing a preferred embodiment of a memory device having a power down circuit according to the present invention.

FIG. 5 is a block diagram of a memory device incorporating a preferred embodiment of an auto power down circuit according to the present invention. As shown in FIG. 5, the preferred embodiment of the auto power down circuit includes a power down timer 40 and a burn-in voltage detector 100. The burn-in voltage detector detects a burn-in voltage in a burn-in mode based on a high level of a control signal (CTL) and outputs a burn-in voltage detecting signal (BIV) to the power down timer 40. Elements of the memory device incorporating the preferred embodiment of the auto power down circuit according to the present invention are similar to the related art except for the power down timer 40 and the burn-in voltage detector 100 as shown in FIG. 5. Thus, a detailed description is omitted.

Figure 6:
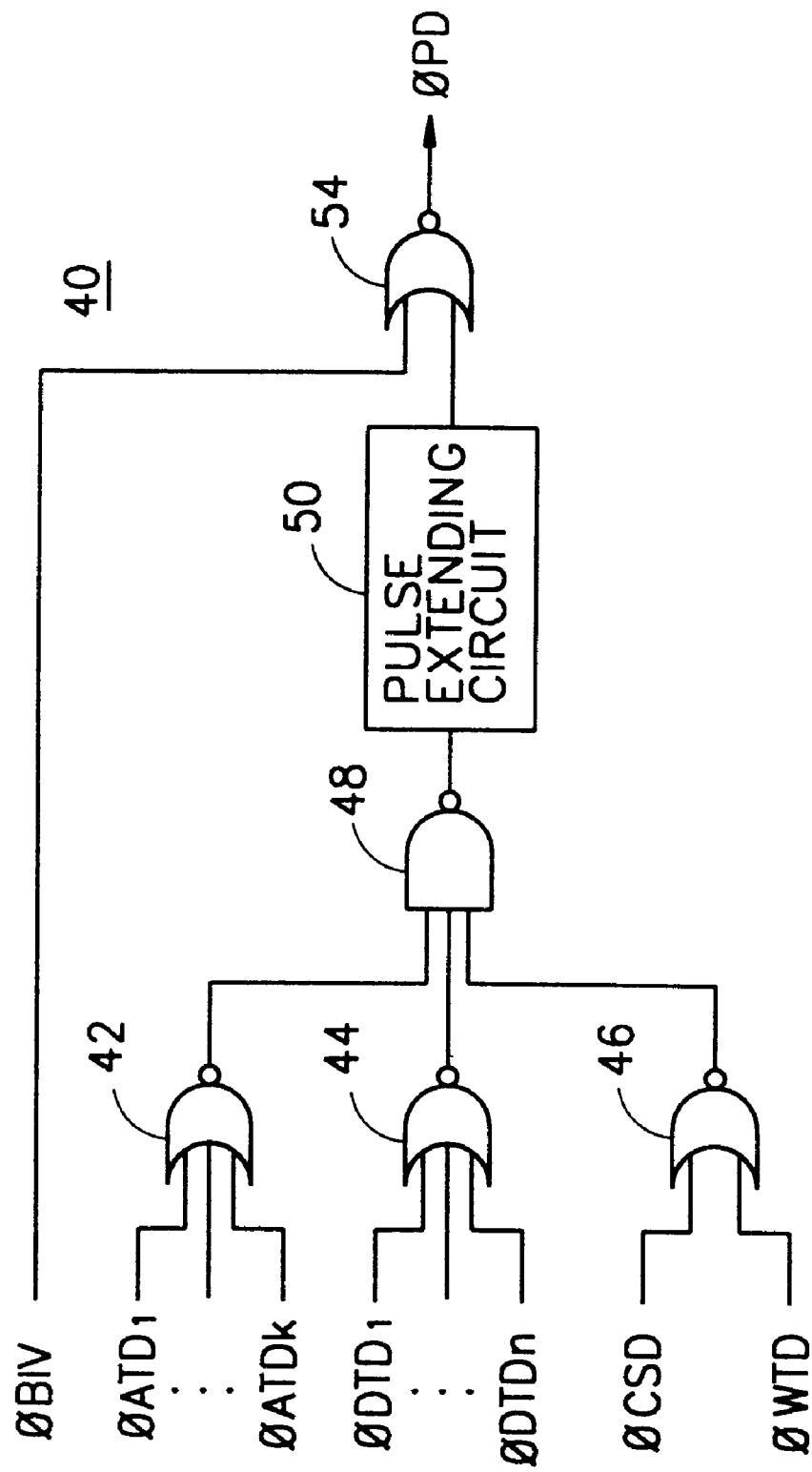
FIG. 6 is a circuit diagram showing a power down timer of the memory device of FIG. 5.

FIG. 6 is a circuit diagram showing the power down timer 40 in the circuit of FIG. 5. As shown in FIG. 6, the power down timer 40 includes a NOR gate 42 for receiving the plurality of address transition detecting signals (ØATD1 ... ØATDk), a NOR gate 44 for receiving the plurality of data input detecting signals (ØDTD1 ... DTDn) and a NOR gate 46 for receiving the chip select detecting signal (ØCSD) and the write mode detecting signal (ØWTD). A NAND gate 48 NANDs the output signals from the NOR gates 42,44,46. A pulse extending circuit 50 receives the output signal of NAND gate 48. A NOR gate 54 receives an output signal from the pulse extending circuit 50 and the burn-in detecting signal (BIV) from the burn-in voltage detector 100 and outputs a high level power down signal (PD) only when neither the output signal from pulse extending circuit 50 nor the burn-in voltage detecting signal (BIV) is a high level.

Figure 7:
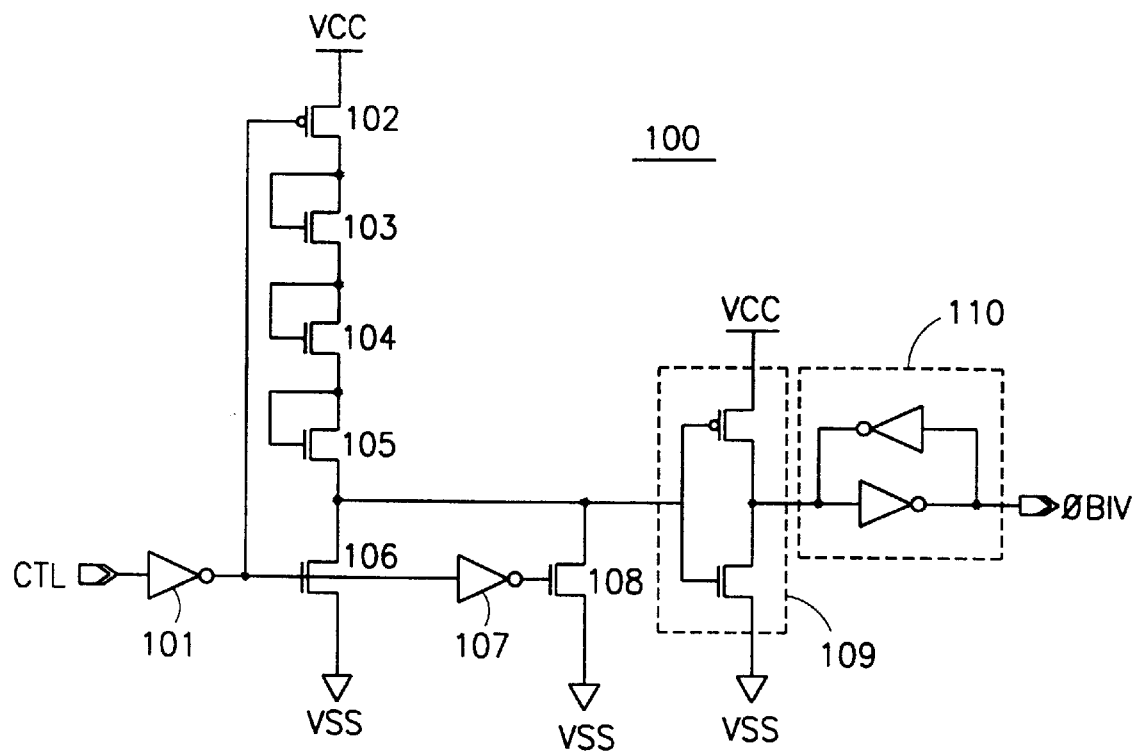
FIG. 7 is a circuit diagram showing a burn-in voltage detector of the memory device of FIG. 5.

FIG. 7 is a circuit diagram showing the burn-in voltage detector 100 in the circuit of FIG. 5. In the burn-in voltage detector 100, an output terminal of an inverter 101 receiving the control signal (CTL) is commonly coupled to the gate of a PMOS transistor 102 and to the gate of an NMOS transistor 106. The source of the PMOS transistor 102 receives a supply voltage (Vcc) and source of the NMOS transistor 106 receives the ground voltage (Vss). NMOS transistors 103,104,105 each have their drains and gates coupled together. The NMOS transistors 103,104,105 are further coupled in series between the drain of PMOS transistor 102 and the drain of NMOS transistor 106. An output terminal of an inverter 107, which receives the output signal from the inverter 101, is coupled to the gate of an NMOS transistor 108. The source of the NMOS transistor 108 is coupled to ground voltage (Vss), and the drain of the NMOS transistor 108 is coupled to the connecting point between the source of the NMOS transistor 105 and the NMOS transistor 106. The connecting point is coupled through a CMOS inverter 109, which includes a PMOS transistor and an NMOS transistor, to a latch 110. The latch 110 includes two inverters coupled in reverse parallel. The burn-in voltage detecting signal (BIV) is generated from the latch 110.

Operations and effects of the preferred embodiment of the present invention will now be described. Upon receiving the chip select signal (0CSB), the write enabling signal (WEB) and the output enabling signal (OEB), the read/write control circuit 11 applies the chip select signal (CS), which is preferably a logically inverted version of the chip select signal (0CSB), to address input circuit 1. The read/write control circuit 11 also applies the write enabling signal (WE), which is preferably a logically inverted version of the write enabling signal (WEB), to the data input circuit 29. The chip select/write mode detector 13 applies the chip select detecting signal (0CSD) and the write mode detecting signal (0WTD) to the power down timer 40 in response to the transition of the chip select signal (0CSB) and the write enabling signal (WEB).

The address input circuit 1 receives a plurality of address bits (A1 . . . Ak) and accordingly provides an address to the row decoder 3 and the column decoder 7. The address transition detector 5 provides the plurality of address transition detecting signals (0ATD1 . . . 0ATDk) to the power down timer 40. The row decoder 3 applies a plurality of row decoding signals through a corresponding plurality of inverters (I1 . . . In) to a corresponding plurality of NOR gates (NOR1 . . . NORn). Each of the NOR gates (NOR1 . . . NORn) also receives the power down signal (PD) from the power down timer 40. Thus, the NOR gates (NOR1 . . . NORn) drive a corresponding one of the plurality of word lines (WL1 . . . WLn) coupled to a plurality of memory cells (MC11 . . . MC1m, . . . ,MCn1 . . . MCnm: hereinafter, "MC11 . . . MCnm"), respectively.

The column decoder 7 generates a plurality of column select signals (CSL1 . . . CSLm) that are applied to the gates of a corresponding plurality of pairs of column select transistors (N1/N1B . . . Nm/NmB). Each of the plurality of pairs of column select transistors (N1/N1B . . . Nm/NmB) is coupled between a corresponding plurality of pairs of bit lines (BL1/BL1B . . . BLm/BLmB) and a pair of data lines (DL/DLB). The data bits on the pair of data lines (DL/DLB) are transmitted to the sense amplifier 35 controlled in accordance with the sense amplifier enabling signal (0SAE).

A pair of sense amplifier output signals (SAO/SAOB) is transmitted to a data input/output bus 39 by a data output buffer 37. The sense amplifier enabling signal (0SAE) is generated from the NOR gate 31 upon receiving the power down signal (PD) and the write enabling signal (WE). The write enabling signal (WE) is also applied to a NOR gate 17 through an inverter 19. The NOR gate 17 receives the inverted write enabling signal (WE) and the power down signal (PD) to generate the write switching signal (0SWE). The write switching signal (0SWE) is applied to the gates of the pair of select transistors 21/23 coupled between the pair of data lines (DL/DLB) and a pair of data input lines (DIN/DINB).

Input data bits from the data input circuit 29 are respectively carried through a pair of inverters 25/27 on the pair of data input lines (DIN/DINB). The data transition detector 33 generates the plurality of data input detecting signals (0DTD1 . . . 0DTDn) that are applied to the power down timer 40 in response to a transition in the input data bits in the data input circuit 29.

FIGS. 9A through 9P are diagrams showing timing during normal mode operations and FIGS. 10A through 10P are diagrams showing burn-in mode operations of a memory device incorporating the preferred embodiment of the power down circuit according to present invention. During write and read cycles, the levels of the detecting signals (0ATD, 0DTD, 0CSD, 0WTD) and the power down signal (0PD) generated from the power down timer 40 in accordance with the burn-in voltage detecting signal (BIV) outputted from the burn-in voltage detector 100 are controlled to determine data input and output with respect to the memory cells (MC11 . . . MCnm).

In the normal mode, the burn-in voltage detector 100 receives a high level control signal (CTL). Thus, the output signal from the inverter 101 becomes a low level to turn on the PMOS transistor 102 and turn off the NMOS transistor 106. Accordingly, the inverter 109 outputs a high level signal when a normal power supply voltage (Vcc) is supplied. The latch 110 receives the high level signal and outputs a low level of the burn-in voltage detecting signal (BIV) as shown in FIG. 9P. The low level burn-in voltage detecting signal (BIV) is in turn inputted to the power down timer 40.

Figure 8:
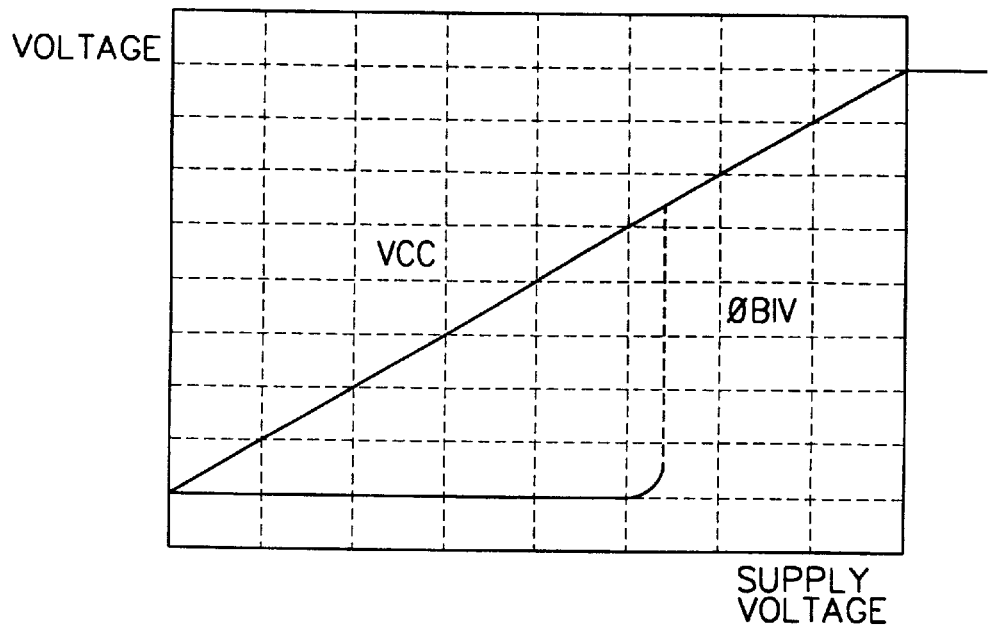
FIG. 8 is a graph showing a burn-in voltage detection characteristic of the burn-in voltage detector of FIG. 7.

In the burn-in mode, the burn-in voltage detector 100 receives a high level of the control signal (CTL). Thus, the output signal from the inverter 101 becomes a low level to turn on the PMOS transistor 102 and turn off the NMOS transistor 106. The NMOS transistor 108 is turned on in accordance with the high level output signal from the inverter 107, which receives the output signal from the inverter 101. The burn-in voltage (Vcc) applied through the PMOS transistor 102 is sequentially reduced through the series NMOS transistors 103–105 and the reduced resultant voltage is applied to the inverter 109. Accordingly, as shown in FIG. 8, the burn-in voltage (Vcc) is gradually increased and subsequently the voltage applied to the inverter 109 reaches a predetermined level. Thus, the turn on amount of the NMOS transistor of the inverter 109 increases and the burn-in detecting voltage applied to the inverter 109 gradually reaches an arbitrary threshold level sufficient for driving a logic gate. Thus, a high level burn-in voltage detecting signal (BIV) is generated from the latch 110, as shown in FIG. 10P and outputted to the power down timer 40. Preferably, the turn on amount of the NMOS transistor 108 is smaller than that of the NMOS transistor 106.

The power down timer 40 as shown in FIG. 6 receives the high level burn-in voltage detecting signal (BIV) through one input terminal of the NOR gate 54. The power down timer further receives an output signal from the pulse extending circuit 50 through the other input terminal of the NOR gate 54 to generate the power down signal (0PD).

The address transition detecting signals (0ATD1 . . . 0ATDk) are inputted to the NOR gate 42. The data input detecting signals (0DTD1 . . . 0DTDn) are inputted to the NOR gate 44. The chip select detecting signal (0CSD) and the write mode detecting signal (0WTD) are inputted to the NOR gate 46. The output terminals of the NOR gates 42,44,46 are coupled to the input terminal of the NAND gate 48. The output terminal of the NAND gate 48 is coupled to the input of the pulse extending circuit 50.

Thus, the power down signal (0PD) outputted from the NOR gate 54 is generated with the value shown in FIG. 9J only in a normal mode operation. In the normal operation mode, a low level burn-in voltage detecting signal (BIV) is applied from the burn-in voltage detector 100. Alternatively, during the normal mode read and write cycles, the burn-in voltage detector 100 can receive a low level control signal (CTL). In this case, the burn-in voltage detector also outputs a low state burn-in voltage detecting signal (BIV), as shown in FIG. 9P, to the power down timer 40.

The power down timer 40 outputs the power down signal (∅PD) shown in FIG. 9J in accordance with the logical state of the detecting signals (∅ATD, ∅DTD, ∅CSD, ∅WTD) as the NOR gate 54 responds to the output signal from the pulse extending circuit 50. Accordingly, while the power down signal (∅PD) is maintained to be low level with a predetermined pulse width by the pulse extending circuit 50 in the power down timer 40, the selected word line (WLi:i=1 ... n) is enabled. Further, the write switching signal (∅SWE) that couples the data input circuit 29 to the pair of data lines (DL/DLB) is enabled, the sense amplifier enabling signal (∅SAE) is generated and the data input circuit 29 is controlled.

When the power down signal (∅PD) becomes high level, the word line (WL), and the data input circuit 29 and/or the sense amplifier 35 are disabled. As a result, during the write cycle, current is inhibited from flowing from the memory cell to the data input circuit 29. In addition, during the read cycle, current is inhibited from flowing from the memory cell to the sense amplifier 35. Thus, during the normal mode operations, the semiconductor memory device incorporating the preferred embodiment of the power down circuit according to the present invention results in operations similar to the related art as shown in the timing waveform drawings of FIGS. 3A–3O.

FIGS. 10A through 10P are diagrams showing timing waveforms of burn-in mode operations of the memory device having the preferred embodiment of the auto power down circuit. The burn-in voltage detector 100 receives a high level of the control signal (CTL) during the write and read cycles and generates a high level of the burn-in voltage detecting signal (BIV) as shown in FIG. 10P to the power down timer 40. In the power down timer 40, the NOR gate 54 receives the high level burn-in voltage detecting signal (BIV), to maintain a low level power down signal (∅PD) as shown in FIG. 10J.

Accordingly, during the write cycle, the word line signal (WLi:i=1 ... n) from the NOR gates (NOR1 ... NORn) in accordance with the row decoding signal from the row decoder 3 is generated as a high level signal as shown in FIG. 10K during a transition cycle of an address (Ai:i=1 ... n) as shown in FIG. 10B. The NOR gate 17 generates a high level write switching signal (SWE) shown in FIG. 10N in accordance with the output signal from the inverter 19 inverting the write enabling signal (WE). The write enabling signal (WE) is preferably the inverted version of the signal (WEB) shown in FIG. 10C. The write switching signal (∅SWE) is applied to the gates of the pair of transistors 21,23 coupled between a pair of data input lines (DIN/DINB) and the pair of data lines (DL/DLB). The NOR gate 31 receives the write enabling signal (WE) and the low level power down signal (∅PD) to generate a low level of the sense amplifier enabling signal (∅SAE) as shown in FIG. 10O to disable the sense amplifier 35.

The column decoder 7 receives the output signal from the address input circuit 1 and generates the plurality of column select signals (CSL1 ... CSLn) to apply to the gates of the plurality of the pairs of column select transistors (N1/N1B ... Nm/NmB) coupled between the plurality of the pairs of bit lines (BL1/BL1B ... BLm/BLmB) and the pair of data lines (DL/DLB). Since the selected word line (WLi:i=1 ... n) and the write switching signal (∅SWE) shown in FIGS. 10K and 10N are maintained high level, some of the memory cells and peripheral circuits performs a write operation during a required time in accordance with the high level burn-in voltage (BIV).

During the read cycle, the word line signals (WLi:i=1 ... n) from the NOR gates (NOR1 ... NORn) in accordance with the row decoding signal generated from the row decoder 3 are generated as a high level signal during a transition of an address (Ai:i=1 ... n). The NOR gate 17 generates a low level write switching signal (∅SWE) as shown in FIG. 10N in accordance with the output signal from the inverter 19. The low level write switching (∅SWE) signal is applied to the gates of the pair of transistors 21,23 coupled between the pair of data input lines (DIN/DINB) and the pair of data lines (DL/DLB). The NOR gate 31 receives the write enabling signal (WE) to generate a high level of the sense amplifier enabling signal (∅SAE) as shown in FIG. 10O to enable the sense amplifier 35.

The column decoder 7 receives the output signal from the address input circuit 1 and generates the plurality of column select signals (CSL1 ... CSLm) to apply to the gates of the plurality of the pairs of column select transistors (N1/N1B ... Nm/NmB) coupled between the pairs of bit lines (BL1/BL1B ... BLm/BLmB) and the pair of data lines (DL/DLB). Since the selected word line signal (WLi:i=1 ... n) and the sense amplifier enabling signal (∅SAE) shown in FIG. 10K and 10D are maintained to be high level, some of the memory cells and peripheral circuits perform a read operation in accordance with the high level burn-in voltage (BIV).

That is, in a burn-in mode, when a voltage having more than a predetermined level is applied to the burn-in voltage detector 100, the burn-in voltage detector 100 judges the burn-in voltage is received and generates a high level burn-in voltage detecting signal (BIV) shown in FIG. 10P. Thereby, an auto power down function is inhibited, and the burn-in effect can be enhanced by the performance of the write/read operations of some of the memory cells and peripheral circuits for a sufficient time.

As described above, the preferred embodiment has various advantages. In normal mode operation, a word line is disabled after data writing on the memory cell during the write cycle. Further, data on the memory cell is read during the read cycle, and then the word line and the sense amplifier are disabled. Consequently, a current path is inhibited, which reduces the power consumption. When the memory device incorporating the preferred embodiment of the auto power down circuit of the present invention is operated in a burn-in mode, a high level voltage is applied for a long time to perform the write/read cycles regardless of the auto power down function. Thereby, premature failures of the memory device can be eliminated and the reliability of the product can be enhanced.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A power down circuit for a memory device that includes a power down timer for generating a power down signal to drive a data input/output operation of a memory cell in response to a plurality of address transition detecting signals, a plurality of data input detecting signals, a chip select detecting signal and a write mode detecting signal, comprising:

a burn-in voltage detector that generates a burn-in voltage detecting signal to drive the power down timer when a burn-in voltage applied to the memory device reaches a predetermined level.

2. The circuit of claim 1, wherein the power down signal is based on the burn-in detecting signal in a burn-in mode.

3. The circuit of claim 1, wherein the burn-in voltage detector generates a low level of the burn-in voltage detecting signal in a first mode of the memory device and a high level of the burn-in voltage detecting signal in a second mode of the memory device.

4. The circuit of claim 1, wherein the burn-in voltage detector comprises:

a voltage detector that selectively passes a burn-in voltage level based on a control signal;

an inverter that inverts an output signal from the voltage detector; and a latch that latches an output signal from the inverter and outputs the burn-in voltage detecting signal.

5. The circuit of claim 4, wherein the voltage detector detects the burn-in voltage level when the control signal becomes a high level and the second mode of the memory device is set.

6. The circuit of claim 4, wherein the voltage detector comprises:

first and second inverters coupled in series to sequentially invert the control signal;

a first transistor coupled in series with a first voltage source to selectively pass a first reference voltage based on an output signal from the first inverter;

a plurality of transistors coupled in series to the first transistor;

a second transistor coupled in series between the plurality of transistors and a second voltage source to selectively pass a second reference voltage based on the output signal of the first inverter; and a second transistor coupled in series between the plurality of transistors and the second voltage source to selectively pass the second reference voltage based on an output signal from the second inverter.

7. The circuit of claim 6, wherein the plurality of transistors are coupled as series resistors, the first and second voltage sources are a supply voltage source and a ground voltage source, the first and second reference voltages are a burn-in voltage and a ground voltage, the first transistor is a PMOS transistor and the second, third and plurality of transistors are NMOS transistors.

8. The circuit of claim 6, wherein a turn on voltage of the second transistor is larger than the third transistor.

9. The circuit of claim 6, wherein the plurality of transistors each have a control electrode and a second electrode coupled together.

10. The circuit of claim 4, wherein the inverter applies a low level voltage to the latch when an output voltage from the voltage detector reaches a prescribed level.

11. The circuit of claim 4, wherein the latch maintains a previous output level until a level of the output signal from the inverter transitions.

12. A memory device, comprising a plurality of memory cells arranged in a matrix form, wherein each cell is coupled to first and second signal lines;

a power down timer that generates a power down signal to control a data input/output operation of a selected memory cell in response to a first signal, a second signal, a third signal and a fourth signal; and a burn-in voltage detector that generates a burn-in voltage detecting signal to control the power down timer.

13. The memory device of claim 12, wherein the power down signal is based on the burn-in detecting signal when a burn-in voltage is received.

14. The memory device of claim 12, wherein the burn-in voltage detector generates a low level of the burn-in voltage detecting signal in a first mode of the memory device and a high level of the burn-in voltage detecting signal in a second mode of the memory device.

15. The memory device of claim 12, wherein the burn-in voltage detector comprises:

a voltage detector that selectively passes a burn-in voltage level based on a control signal;

an inverter that inverts an output signal from the voltage detector; and a latch that latches an output signal from the inverter and outputs the burn-in voltage detecting signal.

16. The memory device of claim 15, wherein the voltage detector comprises:

first and second inverters coupled in series to sequentially invert the control signal;

a first transistor coupled in series with a first voltage source to selectively pass a first reference voltage based on an output signal from the first inverter;

a plurality of transistors coupled in series to the first transistor;

a second transistor coupled in series between the plurality of transistors and a second voltage source to selectively pass a second reference voltage based on the output signal of the first inverter; and a second transistor coupled in series between the plurality of transistors and the second voltage source to selectively pass the second reference voltage based on an output signal from the second inverter.

17. The memory device of claim 16, wherein a turn on voltage of the second transistor is larger than a turn on voltage of the third transistor.

18. The memory device of claim 12, wherein the first and second signal lines are word lines and bit lines, and wherein the first through fourth signals are respectively a plurality of address transition detecting signals, a plurality of data input detecting signals, a chip select detecting signal and a write mode detecting signal.

* * * * *